(12) United States Patent
Hying et al.

(10) Patent No.: US 8,328,387 B2
(45) Date of Patent: Dec. 11, 2012

(54) LED MODULE

(75) Inventors: Ralf Hying, München (DE); Peter Niedermeier, München (DE); Oskar Schallmoser, Ottobrunn (DE)

(73) Assignee: OSRAM GmbH, Munich (DE)

( * ) Notice: Subject to any disclaimer, the term of this patent is extended or adjusted under 35 U.S.C. 154(b) by 514 days.

(21) Appl. No.: 12/523,511

(22) PCT Filed: Jan. 17, 2007

(86) PCT No.: PCT/EP2007/050433
§ 371 (c)(1),
(2), (4) Date: Jul. 16, 2009

(87) PCT Pub. No.: WO2008/086890
PCT Pub. Date: Jul. 24, 2008

(65) Prior Publication Data
US 2010/0066253 A1      Mar. 18, 2010

(51) Int. Cl.
*F21S 10/02* (2006.01)
*H05B 31/26* (2006.01)

(52) U.S. Cl. ........ 362/231; 362/249; 362/243; 362/228; 315/111; 315/149

(58) Field of Classification Search .................. 315/111, 315/149; 361/240, 681, 782, 783, 808, 810; 362/249, 231, 252, 97.3, 294, 373
See application file for complete search history.

(56) References Cited

U.S. PATENT DOCUMENTS

| | | | |
|---|---|---|---|
| 6,689,999 B2 | 2/2004 | Haines et al. | |
| 6,841,947 B2* | 1/2005 | Berg-johansen | 315/169.3 |
| 7,365,991 B2* | 4/2008 | Aldrich et al. | 361/783 |
| 7,478,925 B2* | 1/2009 | Hiyama et al. | 362/249.02 |
| 2002/0179816 A1 | 12/2002 | Haines | |
| 2003/0214242 A1* | 11/2003 | Berg-johansen | 315/169.3 |
| 2006/0092634 A1* | 5/2006 | Hiyama et al. | 362/231 |
| 2006/0121602 A1 | 6/2006 | Hoshizaki et al. | |
| 2007/0242441 A1* | 10/2007 | Aldrich et al. | 361/782 |
| 2008/0245949 A1* | 10/2008 | Morimoto et al. | 250/205 |

FOREIGN PATENT DOCUMENTS

| | | |
|---|---|---|
| DE | 34 22 297 | 12/1985 |
| DE | 10 2005 049 579 | 4/2007 |
| EP | 0 618 653 | 10/1994 |
| WO | WO 2006/052682 | 5/2006 |
| WO | WO 2006/105646 | 10/2006 |

* cited by examiner

*Primary Examiner* — Vibol Tan
(74) *Attorney, Agent, or Firm* — Cozen O'Connor

(57) ABSTRACT

An LED module (10) comprising a thermally conductive circuit board (12); at least one LED chip (14a to 14f) mounted on the thermally conductive circuit board (12); at least one temperature sensor (24) mounted on the thermally conductive circuit board (12), for determining the temperature of the at least one LED chip (14a to 14f); an optical arrangement (16), which is arranged above the at least one LED chip (14a to 14f) and is mounted on the thermally conductive circuit board (12), wherein the optical arrangement (16) has at least one light-guiding section (20); and a light sensor (18) arranged on the thermally conductive circuit board (12), said light sensor being arranged with respect to the at least one light-guiding section (20) in such a way that it can sense light guided in the light-guiding section (20).

12 Claims, 1 Drawing Sheet

LED MODULE

RELATED APPLICATIONS

Figure 1:
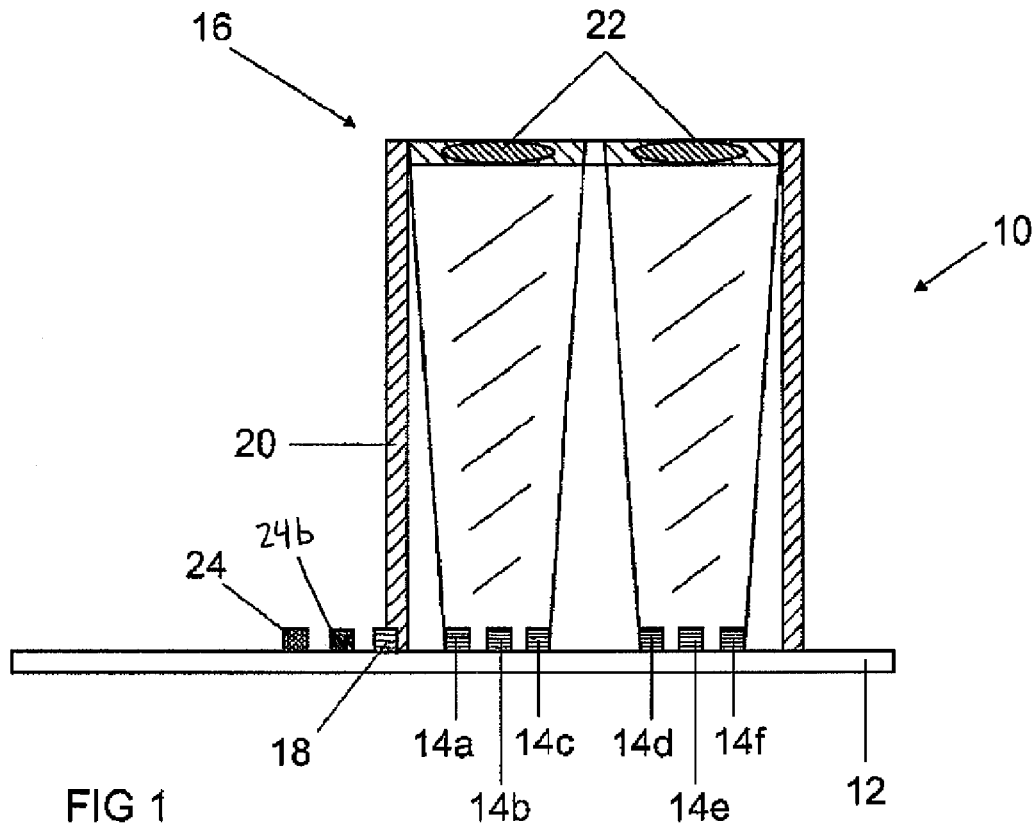

This is a U.S. national stage of application No. PCT/EP2007/050433, filed on Jan. 17, 2007.

FIELD OF THE INVENTION

The present invention relates to an LED module comprising a thermally conductive circuit board, at least one LED chip mounted on the thermally conductive circuit board, at least one temperature sensor mounted on the thermally conductive circuit board, for determining the temperature of the at least one LED chip, an optical arrangement, which is arranged above the at least one LED chip and is mounted on the thermally conductive circuit board, wherein the optical arrangement has at least one light-guiding section. Moreover, the present invention relates to a circuit arrangement comprising at least one LED module of this type.

BACKGROUND OF THE INVENTION

The problem with which the present invention is concerned is based on the fact that the efficiency of LED chips such as are used for front and rear projection applications, for example, changes firstly in operation depending on the temperature and secondly over the lifetime. If LED chips of different colors are used, the color locus of the summation light formed by superimposition of the light from the individual LED chips changes as a result.

In the case of so-called DMDs (Digital Mirror Device=micromirror device), in the prior art the light emitted by the LED chips is measured in the so-called sump, that is to say at the location to which the light is deflected by the mirrors if it is not intended to be directed toward the outside by the optical assembly. A light sensor that can measure the changes in the light is then fitted there in the sump.

What is disadvantageous about this prior art is that the sensitivity range of the light sensor fitted in the sump has to be co-ordinated with the light emitted by the LED module. If, then, a light sensor that does not appropriately match the LED module is used, this leads to incorrect measurement results. If a control loop that is intended to keep constant for example the brightness and/or the color locus of the light emitted by the LED chips is then intended to be driven on the basis of the signal supplied by the light sensor, reliable functioning of such a control loop cannot be ensured. The same correspondingly holds true if an appropriately matching light sensor is incorporated in the sump in an incorrectly adjusted manner. A laborious readjustment or a complicated adaptation of the control loop used for control is the consequence.

SUMMARY OF THE INVENTION

The One object of the present invention is to provide an LED module configured in such a way that control of a property of the light emitted by the LED chips is made possible more reliably.

The present invention takes into account the knowledge that more reliable control than in the case of the procedure known from the prior art is made possible if the light sensor is already part of the LED module. Accordingly, the LED module has a light sensor arranged on the thermally conductive circuit board, said light sensor being arranged with respect to the at least one light-guiding section in such a way that it can sense light guided in the light-guiding section.

On the part of the manufacturer, this ensures that a light sensor which appropriately matches the respective LED chips for the control of at least one property of the light emitted by the LED chips is always provided. Moreover, said light sensor is already correctly adjusted on the part of the manufacturer; incorrect measurements are therefore precluded. A subsequent adaptation of the control loop or a complicated readjustment can be obviated. Moreover, since the light sensor is mounted on the thermally conductive circuit board where the temperature sensor and also the LED chips are already mounted, this can be accomplished virtually in one work operation. A complicated insertion of the light sensor in the sump, as was necessary in the prior art, that is to say of a single electronic component within a specific environment, and also the cabling required therefor, can thus be obviated.

Preferably, the thermally conductive circuit board has a layered construction, wherein one layer, in particular the core, is composed of a metal, preferably aluminum or copper. It is thereby possible to obtain such good thermal conductivity that a single temperature sensor suffices, which makes it possible to determine the temperature of the at least one LED chip and of the light sensor. It is thus possible to construct a fully calibrated system which, as early as during manufacture, can be measured, if appropriate calibrated and assessed with regard to its freedom from faults. The imponderability associated with the LED module from the prior art owing to the use of a defective or unsuitable or incorrectly adjusted light sensor can thus already be precluded on the part of the manufacturer.

Preferably, the at least one light-guiding section of the optical arrangement, in particular the entire optical arrangement, is formed from light-guiding material. This preferably includes materials such as glass, plexiglas and further light-guiding plastics. In the preferred field of application of DMDs as already mentioned, this optical arrangement serves to direct the light from the at least one LED chip onto the microdisplay.

The light sensor is preferably arranged between the light-guiding section and the thermally conductive circuit board. This opens up the possibility of mounting the light sensor in one work operation together with the other components on the circuit board, wherein the optical arrangement is arranged on the circuit board in a further work operation. In the region of the light sensor, therefore, the optical arrangement has a cut-out that takes account of the height of the light sensor—and, depending on the width of the light sensor, also the width thereof.

It is particularly preferred in this case if the optical arrangement has at least one edge and at least one lens, wherein the light-guiding section is formed by the edge, wherein the edge is arranged with respect to the lens in such a way that light which is correlated with the light passing through the lens is guided in the edge. Since the ratio of scattered light, which ultimately falls onto the light sensor, to emitted light, which is the light which passes through the lens, is substantially constant, a calibration is therefore possible. The light impinging on the light sensor can therefore be reliably used for assessing the properties of the light which passes through the lens.

The LED module preferably comprises a plurality of LED chips, wherein the LED chips are designed to emit light of different colors or the same color. It is particularly preferred in projection applications if LED chips are provided for the colors red, green and blue.

As already mentioned, in one preferred embodiment, the temperature sensor can be arranged in such a way that it is suitable for determining the temperature of the light sensor as well. However, it can also be provided that provision is made of a further temperature sensor for determining the temperature of the light sensor. It is thus possible then to perform even more accurate measurements and thus calibrations of the system, in particular concerning the phase shortly after an LED module according to the invention has been switched on, during which the light sensor and the LED module are not yet at the same temperature owing to the inertia of the thermal convection.

In accordance with a second aspect, the present invention also relates to a circuit arrangement comprising at least one LED module according to the invention.

Particularly preferably, a circuit arrangement of this type furthermore has a control device, which is designed to determine, from the signal provided by the light sensor, the actual value of at least one property of the light emitted by the at least one LED chip and to control said value to the desired value of the at least one property, said desired value being provided by a desired value predefining device. Relevant control algorithms suitable for this purpose are known to the person skilled in the art. By way of example, reference should be made to the control algorithm presented in DE 10 2005 049 579.6.

The at least one property with respect to which control is effected is preferably the brightness or the color locus of the light emitted by the at least one LED chip. It is thus possible then to comply with this property over the temperature and the lifetime of the at least one LED chip, taking account of certain limits.

Particularly preferably, the control is effected taking account of the temperature of the light sensor. The temperature dependencies of the light sensor, which is usually also realized as a semiconductor component, can thus also be corrected during the control, whereby it is possible for the at least one property of the light from the at least one LED chip to be kept constant even more accurately.

An LED module according to the invention and a circuit arrangement according to the invention can be used, in principle, in all projection applications, independently of the image modulator (DMD, LCD=Liquid Crystal Device, LCOS=Liquid Crystal on Silicon). Furthermore, it is also suitable for other fields of application in which LED modules are used, for example in general lighting.

BRIEF DESCRIPTION OF THE DRAWING(S)

Figure 2:
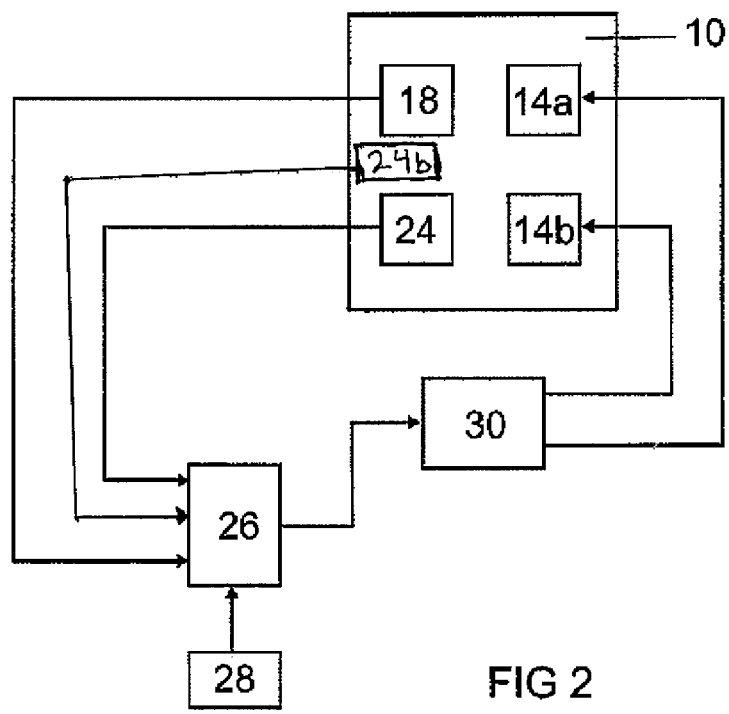

An exemplary embodiment of an LED module according to the invention will now be described in greater detail below with reference to the accompanying drawings, in which:

FIG. 1 shows the construction of an LED module according to the invention in a schematic illustration; and FIG. 2 shows the construction of a circuit arrangement according to the invention in a schematic illustration.

PREFERRED EMBODIMENT OF THE INVENTION

FIG. 1 shows the construction of an LED module 10 according to the invention in a schematic illustration. In this case, a plurality of LED chips 14a to 14f are arranged on a thermally conductive circuit board 12, which preferably has a layered construction, wherein one layer, in particular the core, is composed of a metal, preferably aluminum or copper. Said LED chips 14a to 14f can emit light of different colors or else light of the same color. A primary optical assembly 16 is provided as an optical arrangement above said chips, wherein the regions composed of optically light-guiding material are illustrated in hatched fashion in the present case. An LED module 10 according to the invention furthermore has a light sensor 18, which is arranged in an edge 20 of the optical arrangement 16 in such a way that scattered light of the light passing through lenses 22 of the optical arrangement 16 falls onto the light sensor 18. The light sensed by the light sensor 18 is thus correlated with regard to at least one property with the light passing through the lenses 22 of the optical arrangement, for example with regard to the brightness or the color locus. Moreover, the LED module 10 according to the invention has a temperature sensor 24, which is arranged with respect to the LED chips 14a to 14f and the light sensor 18 in such a way that it is suitable for determining their temperature. Instead of the one temperature sensor provided in accordance with the embodiment from FIG. 1, it is also possible for at least two temperature sensors to be provided in order to enable the temperature of the at least one LED chip 14a to 14f and of the light sensor 18 to be determined even more precisely.

FIG. 2 shows the construction of a circuit arrangement according to the invention in a schematic illustration. It comprises at least one LED module 10 according to the invention, which, for its part, comprises a light sensor 18 and also a temperature sensor 24 and in the present case two LED chips 14a and 14b. The measured values of the light sensor 24 and of the temperature sensor 18 are fed to a control device 26, which receives, provided by the desired value predefining device 28, at least one desired value of at least one property of the light emitted by the LED chips 14a, 14b. The control device 26, in which a corresponding control algorithm is stored, thereupon supplies a corresponding signal to a drive device 30, which, for its part, then drives the LED chips 14a, 14b for setting the at least one desired value predefined by the desired value predefining device 28. However, it can also be provided that provision is made of a further temperature sensor 24b for determining the temperature of the light sensor.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. An LED module comprising:
   a thermally conductive circuit board;
   at least one LED chip mounted on the thermally conductive circuit board;
   at least one temperature sensor mounted on the thermally conductive circuit board, for determining the temperature of the at least one LED chip;
   an optical arrangement, which is arranged above the at least one LED chip and is mounted on the thermally conductive circuit board, wherein the optical arrangement has at least one light-guiding section; and
   a light sensor arranged on the thermally conductive circuit board, said light sensor being arranged with respect to the at least one light-guiding section in such a way that it can sense light guided in the light-guiding section.

2. The LED module as claimed in claim 1, wherein the thermally conductive circuit board has a layered construction, wherein one layer is composed of a metal.

3. The LED module as claimed in claim 1, wherein the at least one light-guiding section of the optical arrangement is formed from light-guiding material.

4. The LED module as claimed in claim 1, wherein the light sensor is arranged between the light-guiding section and the thermally conductive circuit board.

5. The LED module as claimed in claim 4, wherein the optical arrangement has at least one edge and at least one lens, wherein the light-guiding section is formed by the edge, wherein the edge is arranged with respect to the lens in such a way that light which is correlated with the light passing through the lens is guided in the edge.

6. The LED module as claimed in claim 1, wherein the LED module comprises a plurality of LED chips, wherein the LED chips are adapted to emit light of different colors or the same color.

7. The LED module as claimed in claim 1, wherein the temperature sensor is arranged in such a way that it is suitable for determining the temperature of the light sensor.

8. The LED module as claimed in claim 1, comprising a further temperature sensor for determining the temperature of the light sensor.

9. A circuit arrangement comprising at least one LED module as claimed in claim 1.

10. The circuit arrangement as claimed in claim 9, further comprising:
a control device, which is adapted to determine, from the signal provided by the light sensor, the actual value of at least one property of the light emitted by the at least one LED chip and to control said value to the desired value of the at least one property, said desired value being provided by a desired value predefining device.

11. The circuit arrangement as claimed in claim 9, wherein the at least one property is the brightness or the color locus of the light emitted by the at least one LED chip.

12. The circuit arrangement as claimed in claim 10, wherein the control is effected taking account of the temperature of the light sensor.

* * * * *